United States Patent [19]
Burgess et al.

[11] Patent Number: 5,293,070
[45] Date of Patent: Mar. 8, 1994

[54] INTEGRATED HEAT SINK HAVING A SINUOUS FLUID CHANNEL FOR THE THERMAL DISSIPATION OF SEMICONDUCTOR MODULES

[75] Inventors: James F. Burgess; Wivina A. A. Rik DeDoncker, both of Schenectady; Donald W. Jones, Burnt Hills; Constantine A. Neugebauer, Schenectady, all of N.Y.

[73] Assignee: General Electric Company, Schenectady, N.Y.

[21] Appl. No.: 973,603

[22] Filed: Nov. 9, 1992

Related U.S. Application Data

[63] Continuation of Ser. No. 681,845, Apr. 8, 1991, abandoned.

[51] Int. Cl.$^5$ .............. H01L 23/02; H01L 25/04; H02B 1/00; H02K 5/00
[52] U.S. Cl. .................. 257/714; 361/689; 361/699; 257/712; 257/717
[58] Field of Search .............. 357/82; 361/382, 385; 257/714, 712, 713, 715, 716, 717

[56] References Cited
U.S. PATENT DOCUMENTS

| | | | |
|---|---|---|---|
| 3,744,120 | 7/1973 | Burgess et al. | 29/494 |
| 3,911,553 | 10/1975 | Burgess et al. | 228/173 |
| 4,409,278 | 10/1983 | Jochym | 428/163 |
| 4,551,787 | 11/1985 | Mittal et al. | 361/385 |
| 4,563,383 | 1/1986 | Kuneman et al. | 428/216 |
| 4,672,422 | 6/1987 | Schierz | 257/714 |
| 4,884,168 | 11/1989 | August et al. | 257/714 |

*Primary Examiner*—Andrew J. James
*Assistant Examiner*—Carl Whitehead, Jr.
*Attorney, Agent, or Firm*—Marvin Snyder

[57] ABSTRACT

An integrated heat sink module includes a sinuously channeled base and a bonded top surface electrode that is dielectrically isolated from the base. The top surface electrode acts as a common modular electrode capable of conducting heat to an ultimate cooling medium with no intervening thermal barrier. Constrained copper technology (CCT) is employed to ensure that the relatively low effective temperature coefficient of expansion of the channel base is acquired by the channel cover, which is the dielectrically (but not thermally) insulated top surface, and that the common electrode is integrated with, by forming a part of, the fluid channel in the base. The heat sink weight is reduced significantly by the channeling, while use of the CCT technology ensures high reliability and integrity of the module.

3 Claims, 4 Drawing Sheets

INTEGRATED HEAT SINK HAVING A SINUOUS FLUID CHANNEL FOR THE THERMAL DISSIPATION OF SEMICONDUCTOR MODULES

This application is a continuation of application Ser. No. 07/681,845, filed Apr. 8, 1991, now abandoned.

RELATED APPLICATION

This application is related to application Ser. No. 07/603,495 filed Oct. 26, 1990 and entitled: "DIRECT THERMOCOMPRESSION BONDING TECHNOLOGY FOR THIN ELECTRONIC POWER CHIP PACKAGES" by C.A. Neugebauer et al., which is hereby incorporated by reference. Neugebauer et al. teach metal-to-metal bonding technology and certain metal-to-ceramic bonding methods. Also related and incorporated by reference herein is application Ser. No. 07/454,547, filed Dec. 21, 1989 and entitled: "ENHANCED DIRECT BOND COPPER PROCESS STRUCTURE" by H.F. Webster et al. The Webster et al. disclosure specifically relates to the field of metal-to-metal compound eutectic direct bonding.

BACKGROUND OF THE INVENTION

1. Field of the Invention

The present invention relates generally to a semiconductor circuit component heat sink and, more particularly, to an integrated heat sink which provides a common electrode for a plurality of semiconductor devices. The invention also relates to direct bonding processes in which metal-to-metal compound eutectic bonds join a metal to a ceramic element or to another metal.

2. Background Information

Semiconductor power modules mounted on heat sinks (i.e., devices used to dissipate heat) have heretofore been bolted thereto, and employ thermal grease to improve the transfer of heat from module chips to the heat sink proper. In addition to adding weight, the mounting apparatus configuration adds thermal resistance to the cooling path. The increased weight results from the necessity of using a heavy copper base plate, and the added thermal resistance in the cooling path is attributable to the additional interface (the base plate) between the chip or module bases and the ultimate heat exchange medium (generally the environment).

A module that eliminates the aforementioned heavy copper base plate has recently been constructed in accordance with the invention. Essentially, electronic circuit components such as IGBTs (Integrated Gate Bipolar Transistors), diodes or MCTs (MOS Controlled Thyristors) are soldered directly to the heat sink. Thus a portion of the heat sink serves as a common electrode for the devices that are soldered directly thereto. To assure that the mounting structure truly achieves the lowered thermal resistance that results from direct soldering of an electronic circuit component to a heat sink or element thereof, heat sink means are provided for immediate transfer of acquired heat to the environment. Therefore, the portion of the heat sink acting as the common electrode is situated in direct contact with an environmental heat removal mechanism—in this case, a cooling fluid. Both the cooling fluid source and the heat removal means for the heat sink are electrically isolated from the electronic circuit component packages.

To construct the integrated heat sink of the instant invention, a certain reliance is necessary on previously patented technology. A discussion of such technology follows.

In Burgess and Neugebauer U.S. Pat. No. 3,744,120, "DIRECT BONDING WITH METALS WITH A METAL-GAS EUTECTIC", issued Jul. 10, 1973, a metal member, such as copper, is placed in contact with another metal member, such as nickel, and the metal members are heated to a temperature slightly below the melting point of the lower melting point metal. The heating is performed in a reactive atmosphere, such as a slightly oxidizing atmosphere, for sufficient time to create a metal-gas eutectic melt which, upon cooling, bonds the metal members together. The patent describes various metals (e.g., copper and stainless steel) and reactive gases (i.e., oxygen) that are useful for such bonding. In Burgess and Neugebauer U.S. Pat. No. 3,911,553, "METHOD FOR BONDING METAL TO CERAMIC", issued Oct. 14, 1975, the patentees disclose methods for bonding a metal to a ceramic and, in particular, an improved method for bonding a metal to a ceramic employing a eutectic melt of the metal. A copper sheet, for example, is first surface-treated to produce a layer with which the copper forms a eutectic, notably copper oxide. Thereafter, the bond is acquired similar to the fashion disclosed in U.S. Pat. No. 3,744,120.

Jochym U.S. Pat. No. 4,409,278, issued Oct. 11, 1983 for "BLISTER-FREE DIRECT BONDING OF METALS TO CERAMICS AND METALS", teaches a method for obtaining large-area, blister-free assemblies of direct-bonded metal to a ceramic or metal substrate by providing venting channels in the metal-substrate interface and is therefore worthy of mention in discussions of the direct-bonded metal-to-ceramic substrate or metal-to-metal substrate art. Kuneman et al.,in U.S. Pat. No. 4,563,383, issued Jun. 7, 1986, teach bonding of ceramic (alumina)-to-metal by establishing a copper oxygen eutectic between the layers of ceramic. (The laminated or sandwich structure is noted here for the techniques employed to acquire bending stress equalization). Kuneman et al., as well as Jochym and the two Burgess et al. patents, are hereby incorporated by reference. The aforementioned Webster et al. application Ser. No. 454,547 relates even more directly to the field of metal bonding, particularly direct bonding, than the patents discussed above. The art most relevant to the present invention, as detailed in the foregoing discussion, is thus believed to be mostly metal-on-metal cladding and ceramic substrate sandwiching, along with the considerations which must be given to dealing with stress factors within the clad or sandwiched articles caused by uneven or unconstrained thermal expansion. For this reason, thermal expansion, a causative factor in the delamination of laminates in which the various strata or lamina have disparate temperature coefficients of expansion (TCE), shall be seen to be of paramount consideration in the remainder of this disclosure.

OBJECTS OF THE INVENTION

One object of the invention is to provide an integrated heat sink that includes a common electrode for a plurality of semiconductor devices.

Another object is to provide a semiconductor power module including a heat sink wherein a portion of the heat sink serves as a common electrode for semiconductor devices that are soldered thereto.

Another object is to provide a semiconductor power module including a heat sink wherein a portion of the heat sink that serves as a common electrode for semiconductor devices is situated in direct contact with a cooling fluid.

Another object is to provide a semiconductor power module including a common cathode that is integrated with a fluid conduit through which a heat exchange fluid is passed to remove heat from the common cathode.

SUMMARY OF THE INVENTION

In a semiconductor power module, heat sink enhancements are achieved by providing a common electrode (hereinafter "cathode") to which IGBTs, diodes or MCTs are soldered and with which an environmental dispersion medium (the "environmental sink") interfaces directly. The number of thermal barriers between the chip bases and the ultimate cooling medium is minimized while the heat sink is reduced in weight and constitutes means for exchanging heat with or to the environmental sink. For purposes of this disclosure, and as is generally accepted in the art, the environmental sink is the ultimate cooling medium and may be a gas, liquid or solid. In the present invention, the common cathode, which serves as the standard base plate for one or more devices or modules, is integrated (i.e., combined) with a fluid conduit so that the only barrier between the solid state device base and the environmental sink is the cathode itself and, since the cathode is a common base, the base of the devices thus conveys most of the generated heat directly to the environment.

The actual structure of the invention comprises a copper-beryllia or copper-alumina laminate bonded directly to a conductive planar block which has been sinuously grooved and afforded discrete inlets and outlets. The shape of the groove is chosen so as to eliminate lengthy expanses of uninterrupted metal in a straight direction that passes, in the plane of the block, through several different locations in the groove. This is achieved by directing the groove along a path that makes a plurality of back and forth passes in the block. At the base of the block, a sandwiched or metal clad conductive plate seals the aforementioned channel in the block. What results is an essentially planar block of the same general morphology as the sinuously grooved member and which affords all of the elements of the instant invention. The metal portion (generally copper) of the top plate is the common cathode to which the various aforementioned chip devices are soldered, generally with a 60/40 lead-tin solder having a melting point of 180° C. Eutectically bonded to the common cathode is a beryllia or alumina substrate (or an effective ceramic substitute) which provides electrical isolation but, because of the eutectic bond existing between it and the common cathode, is physically and functionally (i.e., thermally) the same element. Thus, the ceramic substrate communicates directly with the channelization of the sinuously grooved planar block and is eutectically bonded or, if provided with metal underside surfaces, soldered thereto. Finally, a bottom plate comprising a sandwich, generally of copper clad molybdenum, is soldered to the base of the sinuously channeled block with a high temperature (i.e., high lead) solder such as Pb/92.5-Sn/5.0-Ag/2.5, which melts at 280° C. If the upper plate of a common cathode conducting material that is eutectically bonded to a ceramic substrate does not acquire the proper TCE (as will be hereinafter discussed), an additional conductive lamina (i.e., a metal underside) may be bonded to the bottom of the ceramic substrate and, in turn, soldered to the upper portion of the grooved block, preferably with the aforementioned high temperature-high lead solder. Effectively, the same physical and thermal enhancements as mentioned in the first-discussed version of the common cathode/ceramic substrate element are realized.

Consideration of temperature coefficients of expansion is necessary because, in order to effectively produce the heat sink with a sinuous channel therein having segments that are parallel to each other so as to break up the otherwise uninterrupted expanse of copper in the plane of the block, a laminate or sandwich structure of top plate/channeled element/bottom plate must be employed. Once the groove has been created in the block, the sinuous channel resulting therefrom (i.e., the channel) eliminates lengthy expanses of uninterrupted copper in a direction perpendicular to the parallel portions of the channel in the plane of the block. This controls the overall expansion and contraction of the entire block element in that direction due to temperature changes. In the direction parallel to the parallel portions of the channel in the plane of the block, the block is made narrow and incorporates a single void, so that overall expansion and contraction of the block in that direction is not great, in distance measurement. (If the block were required to be of larger width, alternative groove configurations could be employed to eliminate lengthy expanses of uninterrupted copper extending through the width of the block in the plane of the block.) In addition, to merely solder another copper plate to the top and/or bottom would not only defeat the intention of electrically isolating the top plate cathode from the remainder of the heat sink while maintaining complete and efficient thermal consistency and continuity, but additionally, a copper plate would have a TCE of approximately 17.0 ppm/° C., while the copper block containing the sinuous void therein has an effective TCE somewhere in the region of 5.0 to 6.5 ppm/° C. It is necessary to employ an electrically isolated plate at the top of the block (to act as a common electrode) and a constrained TCE-plate at the bottom. Consequently, there was developed what is known as constrained copper technology (CCT), a technology which recognizes that, in the construction of laminates with materials of differing coefficients of expansion, the expansion and contraction of one material will always be controlled or constrained by the other, depending upon such factors as intrinsic TCEs, and the plastic moduli, or ductilities, and hardness of the materials. In the structure of the present invention, the groove or void divides the block into separate segments so that its overall expansion and contraction due to temperature changes is controlled by the temperature change-induced expansion and contraction of the top and bottom plates (each preferably constructed of copper), resulting in an overall TCE which is quite low. The top plate is constrained by the high plastic modulus of the substrate. Since copper is chosen as the common cathode, the ceramic, which has a plastic modulus much greater than that of copper and therefore does not yield as easily under stress, must constrain the copper in much the same fashion as the void modifies the copper TCE in the channeled block element. The bottom plate, being preferably a copper clad molybdenum plate, comprises a copper element constrained by the less ductile molybdenum. Thus, using the CCT described above, there is realized a top plate having a TCE near that of beryllia (6.1), a central or middle block having a TCE of approximately 5.0–6.5 ppm/° C., and a bottom plate having a TCE of approximately 5.0 ppm/° C. In summary, the integrated heat sink module may be described as a sandwiched, sinuously channelized heat sink which is physically and thermally integrated with, yet electrically isolated from, the base plate for solid state devices and modules which are attached to it.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawing(s) in which:

DETAILED DESCRIPTION OF THE PREFERRED EMBODIMENT

A heat sink must be capable of exchanging heat with or to the environment, the ultimate cooling medium, i.e. air, water or earth. The controlling rule in determining secondary ornamentation, such as heat sink modules, is that such ornamentation should never, throughout its modes of operation, become hot. Since most electronic devices are mounted with standard 60/40 solder, "hot" would be properly defined as being at or near the 60/40 solder melting point of 180° C. In the instant invention, the ultimate sink comprises a common base plate or element that is integrated with fluid conduit means. More specifically, the conduit means is a closed fluid channel which has a fluid source input at one end and a fluid source output at the other. Although modules employing the novel integrated heat sink may be cascaded, that is, connected in series so that the fluid from one heat sink module passes through another and/or succeeding modules, such connection would defeat the concept of exchanging heat with or to the environment, at least to a consistent and stable environment. Therefore, in the instant invention, where several of the heat sink modules of the instant invention are to be "ganged", i.e., used together, it is preferred that they be operated in parallel, as from a manifolded fluid source which delivers a cooling fluid at the same (and consistent) temperature to all heat sink modules. The actual choice will remain, of course, with the operator who has final responsibility for determining and specifying electronic heat sink as well as other circuit requirements.

Figure 1:
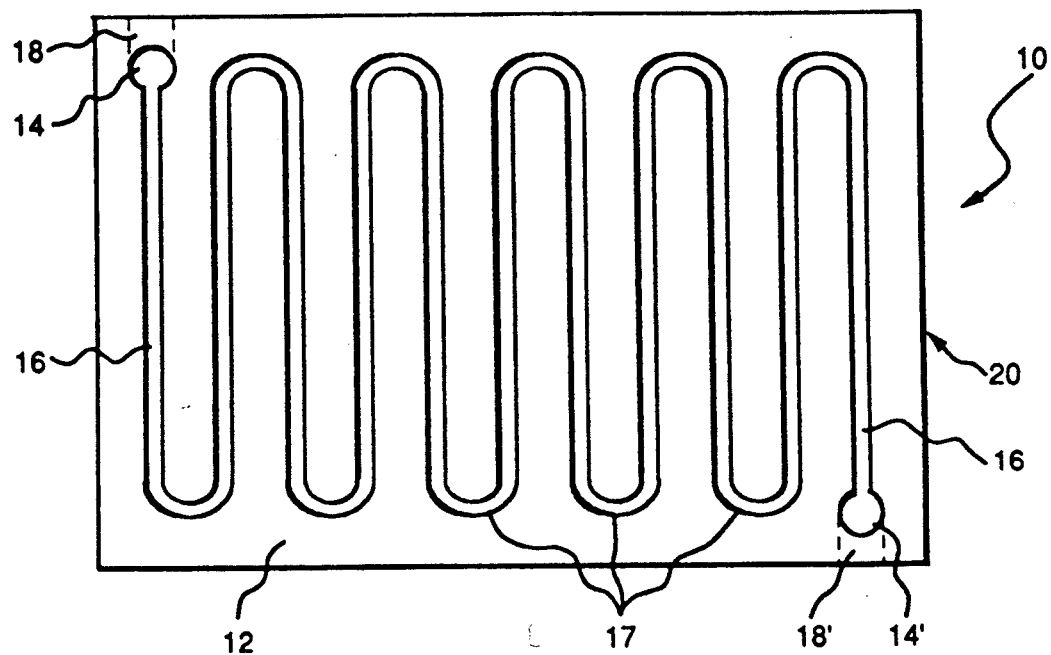
FIG. 1 is a top plan view of the channeled block.
Figure 2:
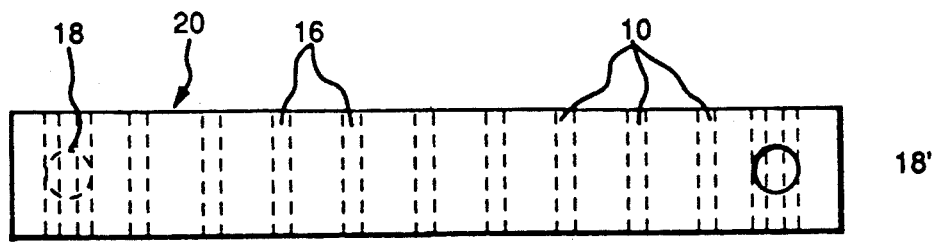
FIG. 2 is a orthographic side view of the FIG. 1 article.

In FIG. 1, a fluid-conducting element 10 is illustrated in a top plan view. This element is preferably comprised of a copper block 12 approximately 2.5 inches long by 1.5 inches wide, and with a nominal thickness of 0.25 inch. In diametrically opposed corners, a hole 14/14' (diameter preferably being approximately 0.125 inch) is bored completely through block 12. Thereafter, a channel 16 is cut generally inward of the block from one hole 14 to the other 14' using a suitable cutting technique such as electric discharge machining (EDM). The channel is cut in a sinuous path 17 and results in fluid-conducting element 10 having a solid continuous periphery 20 and a generally interdigitated interior configuration. Although in some embodiments holes 14/14' may serve as cooling fluid inlet and outlet ports, inlet and outlet ports 18/18' may be formed since they are far more expedient in most operational circumstances, such as where several modules are employed, each having a separate block 12, and cooling fluid is circulated in series from one block to the next. When outlet ports 18/18' are used, holes 14/14' are sealed by plates joined to the upper and lower surfaces of block 12, as shown, for example, in FIGS. 4 and 6. The end elevation of FIG. 2, which is an orthographic illustration of FIG. 1, supplements the foregoing description relative to the inlet placement. In this embodiment, the inlet and outlet bores 18/18' are nominally 0.125 inches in diameter.

Figure 3:
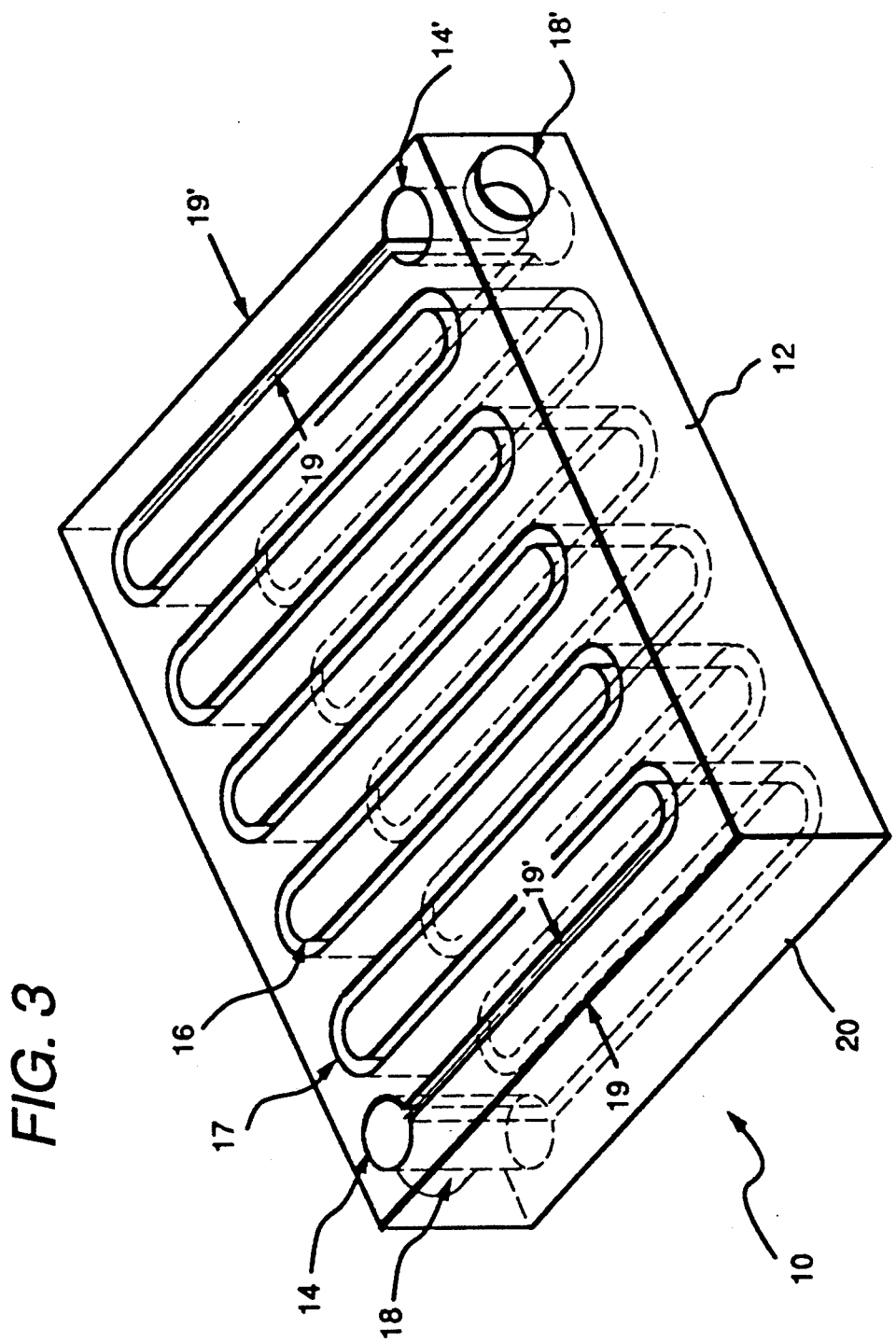
FIG. 3 is an isometric drawing of the channeled block.

The partial isometric drawing of FIG. 3 further elaborates on the illustration of FIG. 1. In this view, it is readily seen that fluid-conducting element 10 has a definite, designed thickness. In the previously stated nominal dimensions for fluid-conducting element 10, the number of channels would be eleven, with a spacing of 0.125 inches between each adjacent pair of the parallel portions of channel 16 and between each outermost parallel portion of channel 16 and the nearest outer periphery 20 (and as represented, for example, by the separation 19/19'). The resulting TCE of fluid-conducting element 10 is approximately 5.0–6.5 ppm/° C., considerably smaller than the approximately 17.0 ppm/° C. TCE of unchanneled block 12. A concomitant benefit in the form of a significant reduction in the amount of copper mass employed, compared to that of the unchanneled block, is also realized.

The final step in the assembly of the integrated heat sink of the instant invention is the application of top and bottom covers to fluid-conducting element 10. Having constructed the basic heat sink module with a known TCE of approximately 5.0–6.5 ppm/° C., a conductive top cover or plate 22 and a metal clad bottom cover or plate 24 are applied to fluid-conducting element 10, as shown in FIG. 4, and are either eutectically bonded thereto or, more expediently, soldered thereto.

Figure 4:
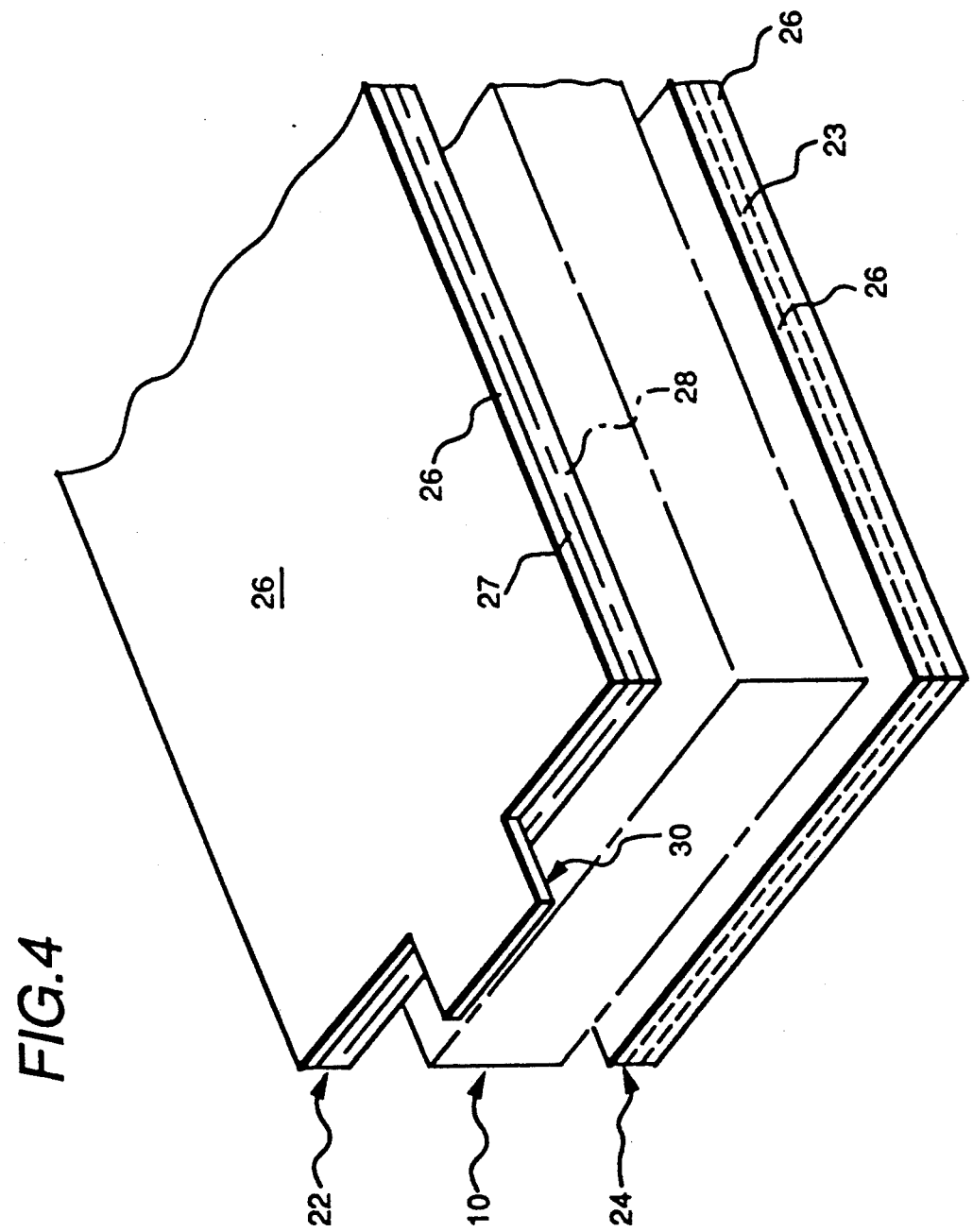
FIG. 4 is an isometric exploded view of a portion of the invention strata.

In FIG. 4, fluid-conducting element 10, illustrated in phantom, is sandwiched between top plate 22 and bottom plate 24. The top plate is a laminate of at least two strata, the upper stratum 26 comprising a conducting element, preferably copper, and the lower stratum 27 comprising a ceramic, preferably beryllia. An understanding of previous direct bonded copper (DBC) techniques would lead one to assume that top plate 22 can be manufactured most economically by simply laminating the beryllia stratum 27 between copper stratum 26 and a bottom stratum 28 and this is precisely what is done in the preferred embodiment. Economy alone, however, is not the driving factor and, in employing the DBC technique, great care must be taken to ensure that uppermost stratum 26 is electrically isolated by the middle stratum 27 from the lowermost stratum 28.

As may be readily discerned from the phantom depiction in FIG. 4, uppermost stratum 26 constitutes the common electrode of the heat sink module to which various semiconductor devices are to be soldered. It is desirable to effect electrical isolation at this point, because it prevents the cooling fluid from being electrically active. One of the primary objectives of the invention can be realized by bringing the electrode into direct contact with the environmental sink, in this case the cooling fluid previously mentioned. Furthermore, the constrained copper technique (CCT) is effectively realized by bonding copper atop ceramic substrate 27 and by bonding the substrate directly to block 10. The disadvantage of this approach is that productionwise it lacks the enhancements of the previously-discussed full top plate 22 laminate depicted in FIG. 4.

In accordance with the invention, top and bottom plates 22 and 24 may be manufactured or supplied independently of fluid-conducting element 10 and only a final assembly process may be required by the prime manufacturer. If all external surfaces of the aforementioned units 10, 22 and 24 are pretinned (i.e., afforded thin layers of a soldering substance), they may be assembled in a singular step by a one-time solder reflowing process. Therefore, it is more expedient, although not absolutely necessary, to fabricate the invention as herein disclosed. Assembly of bottom plate 24, which comprises a plate 23 of molybdenum or similar conductive material having a TCE approximately equal to that of fluid-conducting element 10 and that of top plate 22, is effected during the final solder reflow, discussed above. Thus, plate 23 is either copper plated or totally clad with copper, the TCE of molybdenum constraining the copper in accordance with the earlier described CCT. In FIG. 4, bottom plate 24 is depicted as a conductive stratum 23 clad by, or sandwiched between, copper platings 26, and may be manufactured by either direct bonding techniques or conventional metal-to-metal cladding techniques. Use of copper throughout, of course, lends the various parts to the vastly simplified and expedient solder reflowing process which facilitates single step assembly.

Figure 5:
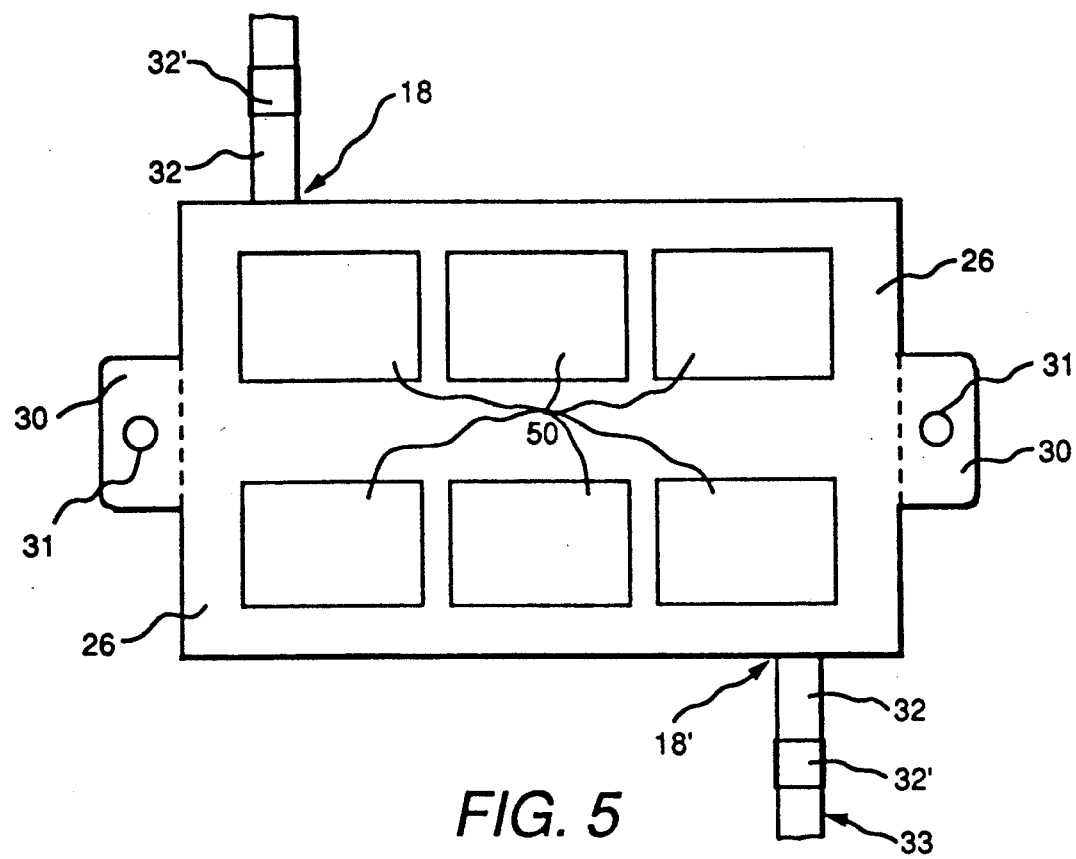
FIG. 5 is a top plan schematic drawing of the chip layout on the invention common cathode.
Figure 6:
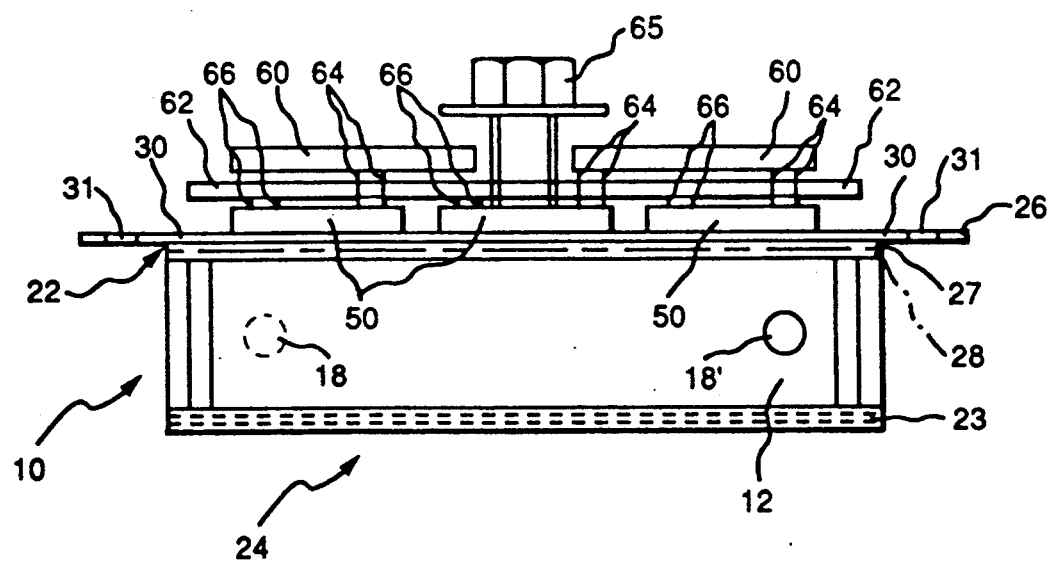
FIG. 6 is a partial end elevation view of the invention.

FIGS. 5 and 6 depict operational employment of the heat sink module of the instant invention. The top plan schematic drawing of FIG. 5 illustrates common conductor plate 26 with extension tabs 30 which are prepared for connection at holes 31 to receive other electrical connection means. Semiconductor devices 50 are illustrated in phantom at the positions at which they would be soldered to the common cathode, plate 26. Finally, connecting hoses or conduits 33 are connected to module input lines 32 (which are inserted in inlet/outlet ports 18/18') by insulating sleeves 32'. Use of insulation for sleeves 32' provides double insulation for greater safety, if required.

In the FIG. 6 end elevation view of an operational employment of the invention, semiconductor devices 50 are shown attached to cathode 26 which comprises the previously described uppermost stratum of top plate 22. All previously mentioned elements such as top plate 22 and bottom plate 24 are depicted in proper relationship with channeled plate 10, while inlet/outlet ports 18/18' are depicted in phantom. Secured immediately above devices 50, by conventional means 65, are a gate plate 60 and an anode plate 62. Connectors 64 and 66 connect the aforementioned electrode plates with their respective components to devices 50. Digression into such matters as electrode plate suspension and connection, as well as mounting such to the heat sink module, is not discussed herein, being that such matters have been previously disclosed in the prior art or are long since established by common practice.

While only certain preferred features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. An electronic semiconductor module heat sink for providing direct heat exchange medium contact with a module electrode and possessing a uniform TCE, comprising:
    a) a base having generally a block shape and comprised of a first thermally conductive material, said base containing a sinuous channel therethrough which communicates between inlet and outlet means;
    b) a first place disposed on top of said base and covering said channel, said first plate comprising said module electrode, said module electrode comprising an electrically and thermally conductive element layer direct bonded to a ceramic substrate, said ceramic substrate contacting directly with said sinuous channel such that a plurality of semiconductor chips that are soldered to said top-disposed plate contact, in common, said electrically and thermally conductive element layer of said module electrode and are in thermal communication with said channel through said electrically and thermally conductive element layer and said ceramic substrate; and
    c) a second plate disposed on said base opposite said top-disposed plate and comprising a second thermally conductive material which is TCE-compatible with said base and covers said channel opposite said top-disposed plate.

2. The heat sink of claim 1 wherein said electrically and thermally conductive element layer comprises copper.

3. The heat sink of claim 1 wherein said second plate comprises copper clad molybdenum.

* * * * *